United States Patent
Iida et al.

(10) Patent No.: US 9,017,770 B2
(45) Date of Patent: Apr. 28, 2015

(54) METHOD OF MANUFACTURING FERROELECTRIC THIN FILM

(71) Applicant: Mitsubishi Materials Corporation, Tokyo (JP)

(72) Inventors: Shintaro Iida, Naka (JP); Hideaki Sakurai, Naka (JP)

(73) Assignee: Mitsubishi Materials Corporation, Tokyo (JP)

( * ) Notice: Subject to any disclaimer, the term of this patent is extended or adjusted under 35 U.S.C. 154(b) by 69 days.

(21) Appl. No.: 13/828,698

(22) Filed: Mar. 14, 2013

(65) Prior Publication Data

US 2013/0260482 A1    Oct. 3, 2013

(30) Foreign Application Priority Data

Mar. 29, 2012 (JP) ................. 2012-075448

(51) Int. Cl.
| | |
|---|---|
| *H01L 41/314* | (2013.01) |
| *C23C 24/00* | (2006.01) |
| *H01L 21/02* | (2006.01) |
| *H01L 41/318* | (2013.01) |
| *C23C 18/12* | (2006.01) |
| *B05B 5/16* | (2006.01) |

(52) U.S. Cl.
CPC ........ *H01L 21/02104* (2013.01); *H01L 41/318* (2013.01); *H01L 41/314* (2013.01); *C23C 18/1254* (2013.01); *B05B 5/1608* (2013.01); *B05B 5/1675* (2013.01); *C23C 18/1216* (2013.01); *C23C 18/1245* (2013.01); *C23C 18/127* (2013.01); *C23C 18/1279* (2013.01); *C23C 18/1283* (2013.01)

(58) Field of Classification Search
CPC ............ C23C 18/1216; C23C 18/1245; C23C 18/1254; C23C 18/127; C23C 18/1279; C23C 18/1283; H01L 21/02104; H01L 41/314; H01L 41/318
USPC .......................... 106/287.18, 287.19; 427/483
See application file for complete search history.

(56) References Cited

U.S. PATENT DOCUMENTS 7,186,296 B2 *   3/2007   Sasaki ........................... 118/665

OTHER PUBLICATIONS

Sachdeva et al, "Effect of sol composition on dielectric and ferroelectric properties of PZT composite films", Ceramics International, pp. 1331-1339, (Sep. 2011).*
Wang et al, "Electrohydrodynamic atomization deposition of PZT sol-gel slurry and sol infiltration on the films", Journal of the European Ceramic Society, pp. 1651-1658 (Jan. 2012).*
D. Wang et al., "Formation of PZT crack-free thick films by electrohydrodynamic atomization deposition," Journal of the European Ceramic Society 28 (2008) pp. 2739-2745.

* cited by examiner

*Primary Examiner* — David M Brunsman
(74) *Attorney, Agent, or Firm* — Locke Lord LLP

(57) ABSTRACT

A method of manufacturing a ferroelectric thin film on a lower electrode by electrostatically spraying a ferroelectric thin film-forming electrostatic spray solution so as to coat the electrostatic spray solution on the lower electrode and form a coated film, drying, calcining, and then firing the coated film so as to crystallize the coated film. In this method, the electrostatic spray solution is a mixed solution in which a ferroelectric thin film-forming sol-gel solution and powder having the same composition as the solid content of the sol-gel solution and having a particle diameter that can be ejected from the spout are uniformly mixed, and, when the metallic compound-converted mass of a metallic compound dissolved in the sol-gel solution is represented by A and the mass of the powder is represented by B, a ratio of B with respect to (A+B) is in a range of 5% to 40%.

2 Claims, 1 Drawing Sheet

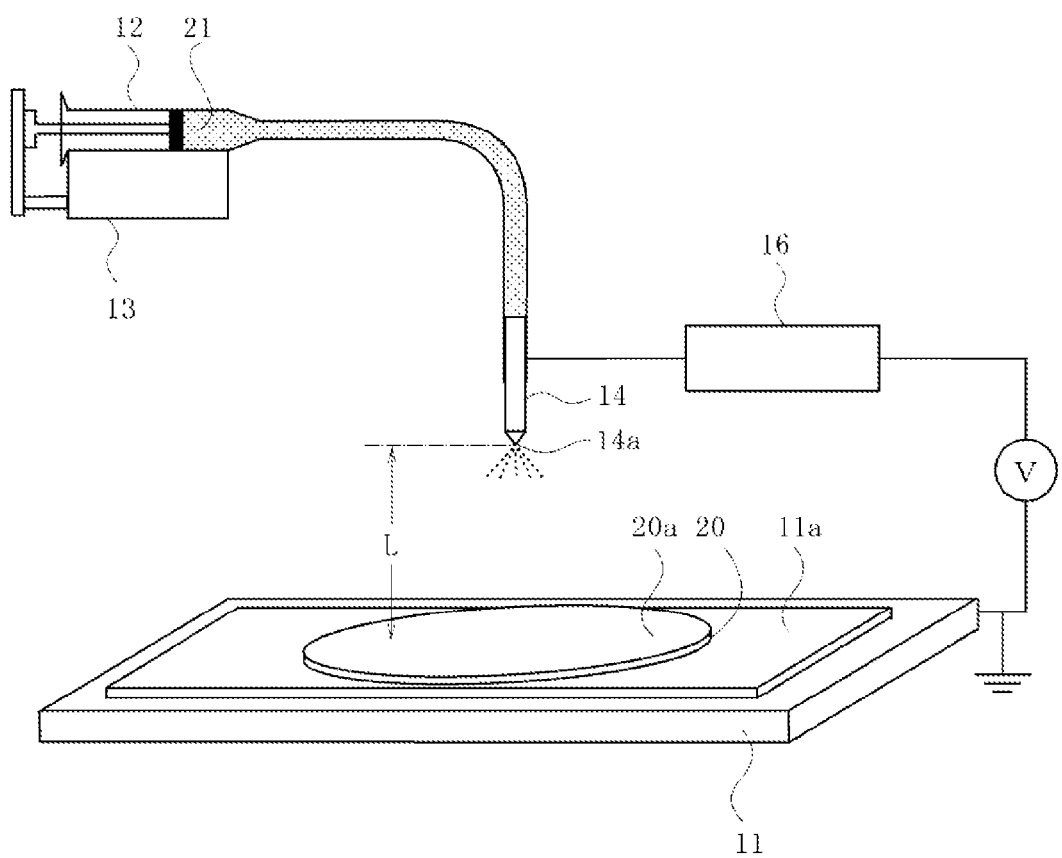

METHOD OF MANUFACTURING FERROELECTRIC THIN FILM

TECHNICAL FIELD

The present invention relates to a method manufacturing a ferroelectric thin film using an electrostatic spray method, and, more specifically to a method of manufacturing a dense and crack-free ferroelectric thin film using a liquid mixture in which a ferroelectric thin film-forming sol-gel solution and powder having the same composition as the sol-gel solution are uniformly mixed, and an electrostatic spray apparatus.

BACKGROUND ART

Electronic devices, such as a dynamic random access memory (DRAM), a ferroelectric random access memory (FeRAM), and an RF circuit, include a capacitor which plays a role as a condenser, and the area occupied by the capacitor in a device also has been becoming narrower in accordance with a demand for the miniaturization or high integration of the device in recent years. The capacitor has a basic structure in which a dielectric layer is sandwiched between both electrodes of an upper electrode and a lower electrode, and the electrostatic capacitance of the capacitor is proportional to the relative permittivity of the dielectric layer and the surface areas of the electrodes, but is inversely proportional to the distance between both electrodes, that is, the thickness of the dielectric layer and the like. Since it is not possible to limit the thickness of the dielectric layer, in order to secure a high electrostatic capacitance in a limited occupied area, it is necessary to use a dielectric material having a higher relative permittivity than the dielectric layer.

Therefore, instead of low-permittivity materials of the related art for which $SiO_2$, $Si_3N_4$, and the like were used, ferroelectric thin films formed of a perovskite-type oxide, such as barium titanate ($BaTiO_3$), barium strontium titanate (hereinafter referred to as "BST"), lead titanate (hereinafter referred to as "PT"), lead zirconate titanate (hereinafter referred to as "PZT") or lanthanum-added lead zirconate titanate formed by adding a small amount of lanthanum to PZT (hereinafter referred to as "PLZT"), are attracting attention. As a method of forming a ferroelectric thin film, chemical solution deposition (CSD), such as a sol-gel method, in addition to physical vapor deposition, such as a vacuum deposition method, a sputtering method or a laser ablation method, and chemical vapor deposition (CVD) has thus far been widely and generally used.

Particularly, compared to CVD, the sputtering method, and the like, the sol-gel method does not require a vacuum process so that the manufacturing costs are low, and there is an advantage that it is easy to form a film in a wide area on a substrate. Furthermore, when the composition of a solution material being used for formation of a ferroelectric thin film is changed, it is easy to obtain the composition of a film at a theoretical ratio, and an extremely thin ferroelectric thin film can be obtained, and therefore the sol-gel method is being expected as a method of forming a high-capacitance thin film capacitor and the like. In a manufacturing method using the sol-gel method, in general, first, a sol-gel solution is prepared, the prepared sol-gel solution is coated on a substrate, and firing and the like are carried out at predetermined temperatures, thereby obtaining a ferroelectric thin film. In a method of manufacturing a ferroelectric thin film using the sol-gel method, a spin coating method and the like have thus far been widely used to coat the sol-gel solution on a substrate. This is because, in a method of manufacturing a ferroelectric thin film using the sol-gel method, the spin coating method is excellent in terms of a possibility of increasing the film thickness uniformity in the substrate surface since a liquid is removed using, for example, a centrifugal force by rotating a substrate at a high speed.

However, in the spin coating method, there was a problem in that, when the sol-gel solution is coated on a substrate, since a majority of the material is scattered away from the substrate and thus wasted, the usage efficiency of the material is extremely poor. Therefore, studies are being made regarding manufacturing methods in which a method other than the spin coating method is used, and, as such a manufacturing method, for example, a method of manufacturing a ferroelectric thin film in which electrostatic spray deposition (hereinafter referred to as "ESD") is used to spray the sol-gel solution on a substrate is known. The method of manufacturing a ferroelectric thin film using ESD is attracting attention particularly in terms of mass production properties or manufacturing costs since, when the sol-gel solution is coated on a substrate, it is possible to deposit approximately 90% of the sol-gel solution sprayed from a spout of a capillary on the substrate so that the usage efficiency of the material is extremely high and the film-forming speed is fast. Among the ESD, a method of manufacturing a high-density PZT ferroelectric thin film in which an electrostatic spray solution having, when the metallic compound-converted mass of a metallic compound dissolved in the sol-gel solution is represented by A and the mass of powder is represented by B, a ratio of B with respect to (A+B) of 83% is coated into 60 layers so as to form an approximately 28 μm-thick film, is disclosed (refer to Non Patent Document 1).

RELATED ART DOCUMENT

Non Patent Document

[Non Patent Document 1] Journal of the European Ceramic society (2008), pp. 2739 to 2745

DISCLOSURE OF THE INVENTION

Problem that the Invention is to Solve

In the thin film obtained using the method described in Non Patent Document 1, a dense and crack-free structure is observed, but pores of less than 400 nm are present in the ferroelectric thin film, and the surface of the ferroelectric thin film is not uniform, and therefore favorable film formation is not achieved.

In consideration of the above phenomenon, the present inventors carried out intensive studies whether it is possible to obtain the same merits even when the above liquid mixture, which is applied to the method of manufacturing a ferroelectric thin film using the spin coating method, is used for the electrostatic spray solution that is used in the method of manufacturing a ferroelectric thin film using ESD, and, consequently, attained the invention.

An object of the invention is to provide a method of manufacturing a ferroelectric thin film in which a liquid mixture, in which a ferroelectric thin film-forming sol-gel solution and powder having the same composition as the solid content of the sol-gel solution and having a particle diameter that can be ejected from a spout are uniformly mixed, is ejected using electrostatic spray, and a dense and crack-free ferroelectric thin film is formed after firing of the formed thin film, and a ferroelectric thin film obtained using the same method.

Means for Solving the Problems

A first aspect of the invention is to provide a method of manufacturing a ferroelectric thin film on a lower electrode by electrostatically spraying a ferroelectric thin film-forming electrostatic spray solution from a spout of a capillary toward the lower electrode of a substrate having the lower electrode so as to coat the electrostatic spray solution on the lower electrode and form a coated film, drying, calcining, and then firing the coated film so as to crystallize the coated film, in which the electrostatic spray solution is a mixed solution in which a ferroelectric thin film-forming sol-gel solution and powder having the same composition as the solid content of the sol-gel solution and having a particle diameter that can be ejected from the spout are uniformly mixed, and, when the metallic compound-converted mass of a metallic compound dissolved in the sol-gel solution is represented by A and the mass of the powder is represented by B, a ratio of B with respect to (A+B) is in a range of 5% to 40%.

A second aspect of the invention is to provide an electrostatic spray solution for forming a ferroelectric thin film when electrostatically sprayed from the spout of the capillary, in which a ferroelectric thin film-forming sol-gel solution and powder having the same composition as the solid content of the sol-gel solution and having a particle diameter that can be ejected from the spout are uniformly mixed, and, when the metallic compound-converted mass of a metallic compound dissolved in the Sol-gel solution is represented by A and the mass of the powder is represented by B, a ratio of B with respect to (A+B) is in a range of 5% to 40%.

Advantage of the Invention

In the manufacturing method of the first aspect of the invention which is a method of manufacturing a ferroelectric thin film on a lower electrode by electrostatically spraying a ferroelectric thin film-forming electrostatic spray solution from a spout of a capillary toward the lower electrode of a substrate having the lower electrode so as to coat the electrostatic spray solution on the lower electrode and form a coated film, drying, calcining, and then firing the coated film so as to crystallize the coated film, the electrostatic spray solution is a mixed solution in which a ferroelectric thin film-forming sol-gel solution and powder having the same composition as the solid content of the sol-gel solution and having a particle diameter that can be ejected from the spout are uniformly mixed, and, when the metallic compound-converted mass of a metallic compound dissolved in the sol-gel solution is represented by A and the mass of the powder is represented by B, the ratio of B with respect to (A+B) is set in a range of 5% to 40%. As a result, the ferroelectric thin film manufactured by being formed, calcined, and fired on the lower electrode has a sense and crack-free structure.

In the manufacturing method of the second aspect of the invention, in the electrostatic spray solution for forming a ferroelectric thin film when electrostatically sprayed from the spout of the capillary, a ferroelectric thin film-forming sol-gel solution and powder having the same composition as the solid content of the sol-gel solution and having a particle diameter that can be ejected from the spout are uniformly mixed, and, when the mass of the sol-gel solution is represented by A and the mass of the powder is represented by B, the ratio of B with respect to (A+B) is set in a range of 5% to 40%. Thereby, the ferroelectric thin film manufactured by being formed, calcined, and fired has a sense and crack-free structure.

BRIEF DESCRIPTION OF THE DRAWINGS

FIG. 1 is a schematic view showing the outline of an ordinary apparatus used in ESD.

BEST MODE FOR CARRYING OUT THE INVENTION

Next, embodiments for carrying out the invention will be described in different sections of "electrostatic spray solution" and "method of manufacturing a ferroelectric thin film using the electrostatic spray solution".

<Electrostatic Spray Solution>

The electrostatic spray solution of the invention is a mixed solution in which a ferroelectric thin film-forming sol-gel solution and powder having the same composition as the solid content of the sol-gel solution and having a particle diameter that can be ejected from a spout are uniformly mixed, in which, when the metallic compound-converted mass of a metallic compound dissolved in the sol-gel solution is represented by A and the mass of the powder is represented by B, the ratio of B with respect to (A+B) is set in a range of 5% to 40%.

Hereinafter, the ferroelectric thin film-forming sol-gel solution, the powder, and the mixed solution, which are necessary for the electrostatic spray solution, will be described sequentially.

First, the ferroelectric thin film-forming sol-gel solution will be described. The ferroelectric thin film-forming sol-gel solution is composed of organic metallic compounds dissolved in an organic solvent so that raw materials for configuring a complex metal oxide form a ratio which supplies a desirable metal atom ratio.

The raw material of the complex metal oxide is preferably a compound in which organic groups are bonded to the respective metal elements of Pb, La, Zr and Ti through oxygen or nitrogen atoms thereof. Examples thereof include one or two selected from a group consisting of metal alkoxides, metal diol complexes, metal triol complexes, metal carboxylates, metal β-diketonate complexes, metal β-diketoester complexes, metal β-iminoketo complexes and metal amino complexes. A particularly preferable compound is a metal alkoxide, a partial hydrolysate thereof, or an organic salt. Among the above, examples of a Pb compound and a La compound include acetates (lead acetate: $Pb(OA_c)_2$, lanthanum acetate: $La(OA_c)_3$), lead diisopropoxide: $Pb(OiPr)_2$, lanthanum triisopropoxide: $La(OiPr)_3$, and the like. Examples of a Ti compound include alkoxides such as titanium tetraethoxide: $Ti(OEt)_4$, titanium tetraisopropoxide: $Ti(OiPr)_4$, titanium tetra n-butoxide: $Ti(OiBu)_4$, titanium tetraisobutoxide: $Ti(OiBu)_4$, titanium tetra t-butoxide: $Ti(OtBu)_4$, and titanium dimethoxy diisopropoxide: $Ti(OMe)_2(OiPr)_2$. As a Zr compound, the same alkoxide as the Ti compound is preferable. The metal alkoxide may be used as it is, but a partial hydrolysate thereof may be used in order to accelerate decomposition.

In order to prepare the ferroelectric thin film-forming sol-gel solution, the raw material is dissolved in an appropriate solvent at a ratio corresponding to a desirable ferroelectric thin film composition, and is adjusted to a concentration suitable for coating.

The appropriate solvent of the ferroelectric thin film-forming sol-gel solution used here is appropriately determined according to the raw material being used, and, generally, it is possible to use a carboxylic acid, an alcohol (for example, ethanol, 1-butanol or propylene glycol which is a polyvalent alcohol), an ester, a ketone (for example, acetone, methyl ethyl ketone), an ether (for example, dimethyl ether, diethyl ether), a cycloalkane (for example, cyclohexane, cyclohexanol), an aromatic-based solvent (for example, benzene, toluene, xylene), other tetrahydrofurane, or a mixed solvent of two or more of the above. Among the above, 1-butanol, ethanol or propylene glycol is particularly preferable in terms of evaporation rate and solubility.

As the carboxylic acid, specifically, n-butyric acid, α-methyl butyrate, i-valeric acid, 2-ethyl butyrate, 2,2-dimethyl butyrate, 3,3-dimethyl butyrate, 2,3-dimethyl butyrate, 3-methylpentanoate, 4-methylpentanoate, 2-ethylpentanoate, 3-ethylpentanoate, 2,2-dimethylpentanoate, 3,3-dimethylpentanoate, 2,3-dimethylpentanoate, 2-ethyl hexanoate or 3-ethyl hexanoate is preferably used.

In addition, as the ester, ethyl acetate, propyl acetate, n-butyl acetate, sec-butyl acetate, tert-butyl acetate, isobutyl acetate, n-amyl acetate, sec-amyl acetate, tert-amyl acetate, isoamyl acetate is preferably used, and, as the alcohol, 1-propanol, 2-propanol, 1-butanol, 2-butanol, isobutyl alcohol, 1-heptanol, 2-heptanol, 2-methyl-2-pentanol or 2-methoxy ethanol is preferably used.

Meanwhile, the total concentration of the raw material of the complex metallic compound in the organic metallic compound solution (sol-gel solution) of the ferroelectric thin film-forming sol-gel solution is preferably set to 10 mass % to 25 mass %.

To the organic metallic compound solution, a β-diketone (for example, acetylacetone, heptafluorobutanoylpivaroyl methane, dipivaroylmethane, trifluoroacetone, benzoylacetone, or the like), a β-ketonic acid (for example, acetoacetic acid, propyonyl acetate, benzoyl acetate, or the like), a β-ketoester (for example, a lower alkyl ester, such as methyl, propyl or butyl, of the above ketonic acid), an oxyacid (for example, lactic acid, glycolic acid, α-hydroxybutyric acid, salicylic acid, or the like), a lower alkyl ester of the above oxyacid, an oxyketon (for example, diacetone alcohol, acetoin, or the like), a diol, a triol, a higher carboxylic acid, an alkanolamine (for example, diethanolamine, triethanolamine, monoethanolamine), a polyvalent amine or the like may be added as a stabilizer at a (the molecular number of the stabilizer)/(the number of metal atoms) of approximately 0.2 to 3 as necessary.

In addition, the organic metallic compound solution preferably includes a polyvalent alcohol as the stabilizer. Among the stabilizers, propylene glycol is particularly preferable as the polyvalent alcohol.

It is preferable to remove particles by carrying out a filtration treatment or the like on the prepared organic metallic compound solution so as to set the number of particles having a particle diameter of 0.5 μm or more (particularly 0.3 μm, and more particularly 0.2 μm) to 50 particles in 1 mL of the solution. When the number of particles having a particle diameter of 0.5 μm or more in the organic metallic compound solution exceeds 50 particles/mL, the long-term storage stability deteriorates. The number of particles having a particle diameter of 0.5 μm or more in the organic metallic compound solution is preferably smaller, and is particularly preferably 30 particles/mL or less.

A method of treating the prepared organic metallic compound solution so as to obtain the above number of particles is not particularly limited, and examples thereof include the following methods. The first method is a filtration method in which a commercially available membrane filter having a pore diameter of 0.2 μm is used, and the solution is pressure-fed using a syringe. The second method is a pressure filtration method in which a commercially available membrane filter having a pore diameter of 0.05 μm and a pressurized tank are combined. The third method is a circulation filtration method in which the filter used in the second method and a solution circulation tank are combined.

In any methods, the particle capture rate of the filter differs depending on the solution pressure-feeding force. It is generally known that the capture rate increases as the pressure decreases, and, particularly, in the first and second method, in order to realize the condition that the number of particles having a particle diameter of 0.5 μm or more is set to 50 or less, the solution is preferably passed through the filter extremely slowly at a lower pressure.

Next, the powder will be described. The powder has the same composition as the solid content of the ferroelectric thin film-forming sol-gel solution, and has a particle diameter that can be ejected from a spout 14a provided at the front end of a capillary 14 in an electrostatic spray apparatus 10 shown in FIG. 1.

For example, in a case in which the solid content of the ferroelectric thin film-forming sol-gel solution is a PZT-related composition material, the powder is also a PZT-related composition material having the same composition as the solution. Therefore, the composition ratios of Pb, Zr and Ti in the solid content of the ferroelectric thin film-forming sol-gel solution and the powder are the same. In addition, in a case in which the particle diameter of the particles in the powder is not a particle diameter that can be ejected from the spout 14a, there is a disadvantage that the powder clogs the spout 14a such that electrostatic spray cannot be smoothly carried out. In more detail, when the aperture of the spout 14a is 150 μm, the particle diameter of the particles which configure the powder is preferably set to 0.1 μm to 0.5 μm. This is because, when the particle diameter exceeds 0.5 μm, there is a disadvantage that the powder clogs the spout 14a.

Next, the mixed solution will be described. The mixed solution is obtained by preparing the ferroelectric thin film-forming sol-gel solution and the powder, and then dispersing the powder in butanol using the powder as a dispersoid and butanol as a dispersion medium so as to manufacture a dispersion fluid. At this time, the mass % of the powder dispersed in butanol is preferably set to 5 mass % to 40 mass % with respect to 100 mass % of butanol. This is because, when the mass % of the powder is less than 5 mass % or exceeds 40 mass %, there is a disadvantage that the dipsersibility decreases.

The blend ratio is prepared so that, when the metallic compound-converted mass of the metallic compound dissolved in the ferroelectric thin film-forming sol-gel solution is represented by A and the mass of the powder is represented by B, the ratio of B with respect to (A+B) is adjusted in a range of 5% to 40%. This is because, when the ratio is less than the lower limit value, there is a disadvantage that cracking becomes liable to occur, and, when the ratio exceeds the upper limit value, there is a disadvantage that the film structure does not become dense. During mixing, appropriate amounts of both solutions are put into an appropriate vessel, such as a beaker or a tank, and the ferroelectric thin film-forming sol-gel solution and the dispersion fluid of the powder are sufficiently stirred so that the solid content of the ferroelectric thin film-forming sol-gel solution and the powder are uniformly mixed and uniformly dispersed in the mixed solution, thereby obtaining an electrostatic spray solution.

<Method of Manufacturing a Ferroelectric Thin Film Using the Electrostatic Spray Solution>

In the method of manufacturing the ferroelectric thin film of the invention, a ferroelectric thin film is formed on a predetermined substrate while the electrostatic spray solution is sprayed using ESD. Hereinafter, the same manufacturing method will be described with reference to FIG. 1.

As the substrate for manufacturing the ferroelectric thin film, a heat-resistant substrate, such as a silicon substrate or a sapphire substrate having a lower electrode formed thereon is used. For the lower electrode formed on the substrate, a material which is conductive and does not react with the ferroelectric thin film, such as Pt, Ir or Ru, is used. The ferroelectric thin film being manufactured is preferably a Pb-containing perovskite-type oxide, and examples thereof include PZT, PLZT, PMnZT, PNbZT, and the like.

In the method of manufacturing the ferroelectric thin film of the invention, an electrostatic spray solution 21 is coated using, for example, the electrostatic spray apparatus 10 shown in FIG. 1 (hereinafter referred to as the apparatus 10) through ESD. The apparatus 10 shown in FIG. 1 is provided with a stage 11 for mounting a substrate 20, which is a subject to be coated during electrostatic spray, or the like, and conduction layer 11a is provided on the surface of the stage 11. In addition, a syringe 12 for storing the electrostatic spray solution 21, which serves as a raw material, and a pump 13 for pressure-feeding the electrostatic spray solution 21 loaded in the syringe 12 are provided. In addition, the metal capillary 14 for spraying the electrostatic spray solution 21 sent out from the syringe 12 toward the substrate 20 mounted on the conduction layer 11a of the stage 11 is provided. The capillary 14 is disposed so that the spout 14a provided at the front end of the capillary 14 faces the surface of the stage 11. In addition, the stage 11 is provided to be vertically movable so that the distance between the spout 14a and the substrate 20 and the like mounted on the stage can be arbitrarily adjusted. In addition, a high-pressure power supply apparatus 16 for applying a direct high voltage to the conduction layer 11a of the stage 11 and the electrostatic spray solution 21 sprayed from the capillary 14 or the spout 14a of the capillary 14 is provided. In ESD, the subjects to be coated, such as the substrate 20 and the like mounted on the stage 11, are used as the positive electrode, the capillary 14 is used as the negative electrode, and a direct high voltage is applied using the high-pressure power supply apparatus 16, thereby producing an electrostatic field between both electrodes. In addition, it is possible to efficiently coat the solution by adsorbing the negatively charged misty electrostatic spray solution 21 to the substrate 20 and the like charged to be the opposite polarity.

In order to manufacture the ferroelectric thin film using ESD, first, the electrostatic spray solution 21 is loaded into the syringe 12 provided in the apparatus 10, and the substrate 20 having the lower electrode 20a is mounted on the conduction layer 11a of the stage 11. In addition, the pump 13 is activated in a state in which a desirable direct high voltage is applied using the high-pressure power supply apparatus 16, and the electrostatic spray solution 21 loaded in the syringe 12 is pressure-fed. Thereby, predetermined liquid amount of the electrostatic spray solution 21 is electrostatically sprayed from the spout 14a of the capillary 14 toward the lower electrode 20a of the substrate 20, and the electrostatic spray solution 21 is coated on the lower electrode 20a of the substrate 20.

In the method of manufacturing the ferroelectric thin film of the invention, when the electrostatic spray solution 21 is sprayed and coated on the lower electrode 20a of the substrate 20 using electrostatic spray, the distance between the spout 14a of the capillary 14 and the lower electrode 20a on the surface of the substrate 20 mounted on the stage 11 (hereinafter referred to as the inter-substrate distance L) is set. At this time, the inter-substrate distance is set so that the refractive index of the coated film after drying and calcination preferably becomes 1.5 or more, and the liquid amount of the electrostatic spray solution per spray is set so that the film thickness becomes 1000 nm or less when the electrostatic spray solution is coated with a single spray process, calcined, and then fired so as to be crystallized. Thereby, it is possible to manufacture a dense ferroelectric thin film. The reason for setting the inter-substrate distance so that the refractive index of the coated film after calcination and firing becomes 1.5 or more is to deposit the electrostatic spray solution sprayed from the spout of the capillary on the substrate in a state in which desirable dampness is retained. The technical reason why a ferroelectric thin film having a desirable film structure can be obtained when the electrostatic spray solution is deposited on the substrate in a state in which desirable dampness is retained is considered to be that non-volatile components and volatile components are deposited at an appropriate proportion on the substrate. Meanwhile, when the electrostatic spray solution is deposited on the substrate in an almost dried state, non-volatile components turn into a particle form, and are deposited on the substrate, and therefore a ferroelectric thin film having a desirable film structure cannot be formed. As the inter-substrate distance L increases, the solvent component and the like in the electrostatic spray solution are evaporated more until reaching the substrate such that the electrostatic spray solution sprayed from the spout of the capillary is deposited in a dried state. Therefore, in order for the electrostatic spray solution to be deposited on the substrate in a state in which desirable dampness is retained, it is preferable to control the distance simply using an actual measurement value of the inter-substrate distance L; however, since the actual measurement value of the inter-substrate distance L is significantly influenced by apparatus-dependent errors and the like, it is difficult to accurately control the inter-substrate distance L for obtaining favorable film qualities. Therefore, in the invention, the relationship between the degree of dampness in the coated film deposited on the substrate and the refractive index of the coated film formed on the substrate after drying and calcination is found, and the inter-substrate distance L is accurately controlled using the refractive index, thereby significantly reducing apparatus-dependent errors and the like.

When the inter-substrate distance L is set so that the refractive index, after drying and calcination becomes less than 1.5, the electrostatic spray solution is deposited on the substrate in an almost dried state, and therefore it is not possible to form a ferroelectric thin film having a desirable dense film structure due to the above reason. Among the above, the inter-substrate distance L is preferably set so that the refractive index of the coated film after drying and calcination becomes 1.5 to 2.0. Meanwhile, the refractive index after drying and calcination refers to the refractive index of a coated film after the electrostatic spray solution is coated on the substrate so as to form the coated film, and then the coated film is dried and calcined under the conditions described below.

In addition, the reason for setting the liquid amount of the electrostatic spray solution per spray so that the film thickness of the fired thin film formed in a single spray process becomes 1000 nm or less is that, in a case in which the liquid amount at this time is set to an amount exceeding 1000 nm in the film thickness, there is a disadvantage that cracking occurs or a dense structure cannot be obtained. Among the above, the liquid amount is preferably set to an amount at which the film thickness is in a range of 100 nm to 1000 nm.

In addition, the applied voltage during the electrostatic spray is preferably set in a range of 15000 V to 20000 V. When the applied voltage is less than the lower limit value, there is a case in which it is difficult to electrostatically atomize the solution in a stable manner. In addition, the atmosphere during electrostatic spray is not particularly limited, and electrostatic spray may be carried out in the atmosphere.

In addition, in the method of manufacturing the ferroelectric thin film of the invention, the electrostatic spray solution is desirably coated only using electrostatic spray. In the manufacturing method of the invention, when the ferroelectric thin film is formed under the above conditions, it is possible to form a film which is excellent in terms of orientation without carrying out coating of the sol-gel solution using the spin coating method, such as forming a buffer layer in advance using the spin coating method. Therefore, the usage efficiency of the material is high, and the mass production properties are also excellent compared to not only the method in which coating is carried out only using the spin coating method but also the method in which the spin coating method is jointly used.

After the electrostatic spray solution is coated using ESD and a coated film is formed, the coated film is dried, calcined, and then fired so as to be crystallized. Drying and calcination are preferably carried out in the atmosphere at 150° C. to 550° C. for 1 minute to 10 minutes using a hot plate or the like.

Since drying and calcination is carried out in order to remove the solvent and to thermally decompose or hydrolyze the metallic compound so as to transform into a complex oxide, drying and calcination are desirably carried out in the air, an oxidation atmosphere, or a water vapor-containing atmosphere. Even during heating in the air, moisture necessary for hydrolysis is sufficiently secured from the humidity in the air. The heating is preferably carried out in two steps of low-temperature heating for removing the solvent and high-temperature heating for decomposing the organic metallic compound.

Meanwhile, the processes from coating using ESD to drying and calcination of the electrostatic spray solution may be carried out once respectively, but it is desirable to repeat the processes through calcination a plurality of times so as to obtain a desirable film thickness and then, finally, carry out firing collectively. However, when the electrostatic spray solution of the invention is used, since there is the powder dispersed in the solution, the number of times of repetition is considered to be smaller than for the sol-gel solution specific to the spin coating of the related art.

Firing is a process for firing the dried and calcined coated film at a temperature of the crystallization temperature or higher so as to crystallize the coated film, which produces a ferroelectric thin film. The firing atmosphere in the crystallization process is preferably $O_2$, $N_2$/Ar, $N_2O$, $H_2$, a mixed gas thereof, and the like. Firing is carried out at 450° C. to 800° C. for approximately 1 minute 60 minutes. Firing may be carried out using an abrupt heating treatment (RTA treatment). In a case in which firing is carried out using an RTA treatment, the temperature-increase rate is preferably set to 10° C./second to 100° C./second.

Using the above processes, the ferroelectric thin film of the invention can be obtained. The ferroelectric thin film is a thin film obtained using a method in which ESD is used. The electrostatic spray solution coated using ESD in the above manner is a mixed solution of the ferroelectric thin film-forming sol-gel solution and the powder. When the electrostatic spray solution is a mixed solution in which the ferroelectric thin film-forming sol-gel solution and the powder having the same composition as the solid content of the sol-gel solution and having a particle diameter that can be ejected from the spout 14a are uniformly mixed, and, when the metallic compound-converted mass of the metallic compound dissolved in the sol-gel solution is represented by A and the mass of the powder is represented by B, the ratio of B with respect to (A+B) is set in a range of 5% to 40%, it is possible to smoothly spray the solution without clogging of the spout 14a due to the mixed solution. In addition, when the above ratio is achieved, it is possible to manufacture a dense and crack-free ferroelectric thin film after calcination and firing.

In addition, since the product is a ferroelectric thin film, the product is considered to have the same refractive index and relative permittivity as a thin film manufactured using a manufacturing method in which the spin coating is used as long as a dense and crack-free thin film is manufactured.

Therefore, the ferroelectric thin film of the invention can be preferably used as a component material in a complex electronic component such as a thin film condenser, a capacitor, an IPD, a DRAM memory condenser, a laminated condenser, a gate insulator of a transistor, a non-volatile memory, a pyroelectric infrared detecting element, a piezoelectric element, an electro-optic element, an actuator, a resonate, an ultrasonic motor or an LC noise filter element.

Example

Next, an example of the invention will be described in detail.

First, Zr tetra-n-butoxide (Zr source), Ti isopropoxide (Ti source), and acetyl acetone (stabilizer) are put into a reaction vessel, and are refluxed in a nitrogen atmosphere. Next, lead acetate trihydrate (Pb source) is added to this compound, propylene glycol (solvent) is added, the solution is refluxed in a nitrogen atmosphere, is distilled under reduced pressure so as to remove the byproducts, then, propylene glycol is further added to the solution so as to adjust the concentration, and, furthermore, a diluted alcohol is added, thereby adjusting the total of the complex metal oxide material in the sol-gel solution to 10 mass %. Thereby, a ferroelectric thin film-forming sol-gel solution having a ratio of the respective metals of Pb/Zr/Ti=110/52/48 in terms of an oxide was obtained. This sol-gel solution was pressure-fed and filtered using a commercially available membrane filter having a pore diameter of 0.2 μm and a syringe so that the number of particles of 0.5 μm or more in 1 mL became one. A ferroelectric thin film-forming sol-gel solution was prepared in the above manner.

Next, powder having the same composition as the ferroelectric thin film-forming sol-gel solution having a ratio of the respective metals of Pb/Zr/Ti=110/52/48 in terms of an oxide was prepared. The average particle diameter of the powder was set to 0.2 μm. However, the maximum particle diameter of the powder was less than the aperture of the spout 14a of the capillary 14, and was set to 0.5 μm in consideration of clearance. The powder (1 g) was fed in 1-butanol (9 g), and sufficiently stirred so as to be dispersed in 1-butanol.

Next, the ferroelectric thin film-forming sol-gel solution and a dispersion fluid of the powder were sufficiently stirred so that the solid content of the ferroelectric thin film-forming sol-gel solution and the powder were uniformly mixed and uniformly dispersed in the mixed solution, when the metallic compound converted mass of the metallic compound dissolved in the sol-gel solution is represented by A and the mass of the powder is represented by B, the ratio of B with respect to (A+B) was made to become 20%, a mixed solution of PZT (110/52/48) was manufactured, and this mixed solution was used as the electrostatic spray solution used in the example.

Next, a ferroelectric thin film was formed on the lower electrode 20a of the substrate 20 on which the lower electrode 20a was formed through ESD in the atmosphere using the apparatus 10 shown in FIG. 1. Specifically, first, the prepared electrostatic spray solution 21 was loaded in the syringe 12 provided in the apparatus 10. In addition, a silicon substrate 20 having a 0.2 ym-thick Pt lower electrode 20a formed using a sputtering method on the surface was prepared as the substrate 20, and the substrate 20 was mounted on an aluminum conduction layer 11a of the stage 11 in the apparatus 10. In addition, the pump 13 was activated in state in which a desirable direct high voltage was applied using the high-pressure power supply apparatus 16, the electrostatic spray solution 21 loaded in the syringe 12 was pressure-fed, and the electrostatic spray solution 21 was electrostatically sprayed at a predetermined liquid amount from the spout 14a of the capillary 14 toward the Pt lower electrode 20a of the substrate 20. Thereby, the electrostatic spray solution 21 was coated on the Pt lower electrode 20a of the substrate 20 so as to form a coated film.

Specific conditions at this time were set in the following manner.

The pressure-feeding amount of the electrostatic spray solution 21 was set to 5 µl/minute, the applied voltage was set to 12000 V, and the distance from the spout 14a of the capillary 14 to the substrate was set to cm. The prepared electrostatic spray solution was coated on the lower electrode 20a of the substrate 20 using the ESD apparatus 10 for 5 minutes, dried and calcined on a hot plate at 300° C., furthermore, the obtained gel film-attached substrate 20 was increased to 700° C. at 10° C./second using RTA, and held for 1 minute. In the present example, a PZT ferroelectric thin film made of the complex metallic compound having a metal ratio of Pb/Zr/Ti=110/52/48 was formed in the above manner.

<Evaluation>

For the evaluation of the PZT ferroelectric thin film obtained in the example, the film thickness was measured, the surface and cross-section were observed using a scanning electron spectroscopy SEM (S-4300SE, manufactured by HITACHI Science System, Ltd.), and the surface structure and cross-section structure were observed. In addition, the surface roughness Ra (µm) of the PZT ferroelectric thin film was measured using a surface profilometer (Dektak150, manufactured by Veeco Instruments Inc.), and the density of the film was evaluated from the smoothness of the film surface using the Ra value. In addition, the refractive index of the film was measured using a spectroscopic ellipsometer (M-2000D1, manufactured by J.A. Woollam Co., Inc.).

Under the above conditions, the film thickness of one layer of the obtained PZT ferroelectric thin film was 500 nm, and an extremely small number of fine pores of approximately 50 nm were observed on the surface, but there was no crack or pore in the cross-section. In addition, the surface roughness Ra of the obtained PZT ferroelectric thin film was approximately 30 nm, and it was possible to obtain a film having an extremely smooth surface. In addition, the refractive index of the obtained PZT ferroelectric thin film was 1.9.

From the above results of the example, it was found that, in the method of manufacturing a ferroelectric thin film according to the invention, when an electrostatic spray solution which is a mixed solution, in which the ferroelectric thin film-forming sol-gel solution and the powder having the same composition as the solid content of the sol-gel solution and having a particle diameter that can be ejected from the spout are uniformly mixed, and, when the metallic compound-converted mass of the metallic compound dissolved in the sol-gel solution is represented by A and the mass of the powder is represented by B, the ratio of B with respect to (A+B) is in a range of 5% to 40%, is used, a dense and crack-free ferroelectric thin film after calcination and firing can be obtained using ESD.

INDUSTRIAL APPLICABILITY

The invention can be used to manufacture a component material and the like for complex electronic components, such as a thin film condenser, a capacitor, an IPD, a DRAM memory condenser, a laminated condenser, a gate insulator of a transistor, a non-volatile memory, a pyroelectric infrared detecting element, a piezoelectric element, an electro-optic element, an actuator, a resonate, an ultrasonic motor or an LC noise filter element.

REFERENCE NUMERALS

10 ELECTROSTATIC SPRAY APPARATUS
11 STAGE
11a CONDUCTIVE LAYER
12 SYRINGE
13 PUMP
14 CAPILLARY
14a SPOUT
16 HIGH-VOLTAGE POWER SUPPLY APPARATUS
20 SUBSTRATE
20a LOWER ELECTRODE
21 MIXED SOLUTION (ELECTROSTATIC SPRAY SOLUTION)

The invention claimed is:

1. A method of manufacturing a ferroelectric thin film on a lower electrode by electrostatically spraying a ferroelectric thin film-forming electrostatic spray solution from a spout of a capillary toward the lower electrode of a substrate having the lower electrode so as to coat the electrostatic spray solution on the lower electrode and form a coated film, drying, calcining, and then firing the coated film so as to crystallize the coated film,
   wherein the electrostatic spray solution is a mixed solution in which a ferroelectric thin film-forming sol-gel solution and powder having the same composition as a solid content of the sol-gel solution and having a particle diameter that can be ejected from the spout are uniformly mixed, and
   when a metallic compound-converted mass of a metallic compound dissolved in the sol-gel solution is represented by A and a mass of the powder is represented by B, a ratio of B with respect to (A+B) is in a range of 5% to 40%.

2. An electrostatic spray solution for forming a ferroelectric thin film when electrostatically sprayed from a spout of a capillary,
   wherein a ferroelectric thin film-forming sol-gel solution and powder having the same composition as a solid content of the sol-gel solution and having a particle diameter that can be ejected from the spout are uniformly mixed, and, when a metallic compound-converted mass of a metallic compound dissolved in the sol-gel solution is represented by A and a mass of the powder is represented by B, a ratio of B with respect to (A+B) is in a range of 5% to 40%.

* * * * *